(12) United States Patent
Lloyd et al.

(10) Patent No.: US 11,119,145 B2
(45) Date of Patent: Sep. 14, 2021

(54) PERFORMANCE TESTING METHOD AND MEASUREMENT SYSTEM

(71) Applicant: Rohde & Schwarz GmbH & Co. KG, Munich (DE)

(72) Inventors: Paul Gareth Lloyd, Munich (DE); Fabricio Dourado, Munich (DE)

(73) Assignee: Rohde & Schwarz & GmbH & Co. KG, Munich (DE)

( * ) Notice: Subject to any disclaimer, the term of this patent is extended or adjusted under 35 U.S.C. 154(b) by 62 days.

(21) Appl. No.: 16/365,138

(22) Filed: Mar. 26, 2019

(65) Prior Publication Data

US 2020/0309847 A1  Oct. 1, 2020

(51) Int. Cl.
*G01R 31/28* (2006.01)
*G01R 31/30* (2006.01)

(52) U.S. Cl.
CPC ..... *G01R 31/2837* (2013.01); *G01R 31/3008* (2013.01)

(58) Field of Classification Search
CPC ... G01B 7/00; G01D 5/00; G01K 3/00; G01L 1/00; G01L 5/00; G01L 9/00; G10L 25/00; G01Q 60/00; G01R 1/00; G01R 3/00; G01R 23/00; G01R 27/00; G01R 29/00; G01R 31/00; G01R 35/00; G05B 23/00; G06F 8/00; G06F 17/00; G06F 30/00; G01C 9/00; G01F 17/00; G01F 27/00; G01F 2017/00; G01F 2021/00; H01L 22/00; H01L 23/00; H01L 24/00; H01L 25/00; H01L 27/00; H01L 29/00; H01L 2223/00; H01L 2224/00; H01L 2924/00; H01R 9/00; H01R 12/00; H02M 1/00; H02M 3/00; H02M 7/00; H02M 2001/00; H02M 2003/00; H02P 5/00; H03B 5/00; H03D 3/00; H03D 7/00; H03F 1/00; H03F 3/00; H03F 2200/00; H03F 2203/00; H03G 1/00; H03G 3/00; H03H 7/00; H03H 11/00; H03H 19/00; H03J 1/00; H03J 3/00;
(Continued)

(56) References Cited

U.S. PATENT DOCUMENTS

2008/0086668 A1*  4/2008  Jefferson ............ G01R 31/2848
                                                          714/741
2014/0266243 A1*  9/2014  Baker ....................... G06F 1/30
                                                          324/537

FOREIGN PATENT DOCUMENTS

WO  2003017466 A2  2/2003
WO  2009126007 A2  10/2009

* cited by examiner

*Primary Examiner* — Melissa J Koval
*Assistant Examiner* — Joseph O Nyamogo
(74) *Attorney, Agent, or Firm* — Schwabe, Williamson & Wyatt, P.C.

(57) ABSTRACT

A performance testing method for determining a performance of a device under test having non-linear characteristics is disclosed. The performance testing method comprises the following steps:
  generating a hard clipper model of said device under test;
  generating a test signal having predefined properties;
  forwarding said test signal to the device under test, wherein the device under test generates an output signal based on said test signal;
  feeding said hard clipper model with said test signal, thereby generating a model output signal; and
  comparing said output signal to said model output signal in order to determine the performance of the device under test.

(Continued)

Moreover, a measurement system for determining a performance of a device under test having non-linear characteristics is disclosed.

11 Claims, 5 Drawing Sheets

(58) Field of Classification Search
CPC ....... H03J 2200/00; H03K 17/00; H03L 7/00; H03L 2207/00; H04B 17/00; H04L 27/00; H04R 3/00; H04R 29/00; H04W 24/00; H05K 1/00; H05K 3/00; H05K 7/00; H05K 2201/00
See application file for complete search history.

PERFORMANCE TESTING METHOD AND MEASUREMENT SYSTEM

FIELD OF THE DISCLOSURE

Embodiments of the present disclosure relate generally to a performance testing method for determining a performance of a device under test having non-linear characteristics. Further, embodiments of the present disclosure generally relate to a measurement system for determining a performance of a device under test having non-linear characteristics.

BACKGROUND

For the development of new electronic components of all kinds, it is important to compare the performance of the newly developed electronic components to the performance of already existing ones.

Similarly, certain electronic components or devices under test need to be tested end-of-line in order to ensure that they work properly.

A common problem in both scenarios is that the measurement conditions may vary or may be difficult to reproduce such that there is no common reference for the determination of the performance of a device under test. Thus, the results of such performance measurements may lack comparability, and therefore also significance.

Usually, the results of such performance measurements are compared to data sheets of competitors. However, the test conditions may not be clear such that comparison is critical.

Accordingly, there is a need for a performance testing method for determining a performance of a device under test as well as for a measurement system for determining a performance of a device under test that allow for a better comparability of the performance of the device under test.

SUMMARY

Embodiments of the present disclosure provide a performance testing method for determining a performance of a device under test having non-linear characteristics. The performance testing method comprises the following steps:
generating a hard clipper model of said device under test;
generating a test signal having predefined properties;
forwarding said test signal to the device under test, wherein the device under test generates an output signal based on said test signal;
feeding said hard clipper model with said test signal, thereby generating a model output signal; and
comparing said output signal to said model output signal in order to determine the performance of the device under test.

As already stated, the device under test has non-linear characteristics. In other words, if the device under test is supplied with an input signal having a certain amplitude, an amplitude of a corresponding output signal generated by the device under test does not scale linearly with the input signal amplitude but rather in a non-linear way. Generally, the non-linear characteristics may result from imperfections of the device under test that cannot be avoided during the manufacturing of the respective device under test.

The hard clipper model is an idealized model of the device under test. Particularly, the hard clipper model corresponds to an ideally manufactured device under test. The hard clipper model does not exhibit a non-linear behavior as the device under test, but rather a linear behavior of output amplitude versus input amplitude.

Thus, by comparing the output signal of the device under test to the model output signal, the performance of the device under test can be directly compared with the idealized, i.e. best possible realization of the device under test. Accordingly, the performance of every device under test can be determined and compared in a meaningful way, as the hard clipper model forms a common and reproducible basis for the comparison.

In fact, the hard clipper model provides a benchmark, particularly an absolute benchmark, for the device under test in contrast to other devices of competitors. The other devices of competitors may only provide a relative comparison.

The model module may be established in software by a software module, i.e. as a computer program. Accordingly, the hard clipper model may also be established in software by a software module, i.e. as a computer program. Alternatively, the model module may be established as a combination of hardware and software or even as pure hardware.

For instance, said test signal may relate to a characteristic waveform.

Thus, a digital representative of said waveform, corresponding to the test signal, may be forwarded to the hard clipper model instead of an analog signal.

In contrast, the device under test may receive an analog signal that encompasses the characteristic waveform.

Accordingly, the test signal may relate to a digital signal, namely a digital representative of said waveform, and/or to an analog signal.

According to an aspect of the present disclosure, alone or in combination with any other aspect, at least one characteristic quantity of the output signal is determined and the corresponding characteristic quantity of the model output signal is determined, wherein the at least one characteristic quantity comprises at least one predefined distortion characteristic, and wherein the characteristic quantities of the output signal and the model output signal are compared with each other in order to determine the performance of the device under test. Generally, the distortion characteristic is a measure for the non-linearity of the device under test. Accordingly, by comparing the characteristic quantities comprising the distortion characteristic, a measure for the deviation of the real behavior of the device under test from the ideal, linear behavior is obtained.

According to a further aspect of the present disclosure, alone or in combination with any other aspect, wherein the at least one characteristic quantity of the output signal and the at least one characteristic quantity of the model output signal are both visualized on a display. More precisely, both the at least one characteristic quantity of the output signal and the at least one characteristic quantity of the model output signal are visualized in a common diagram. This way, the result of the performance testing method is presented to a user in a particularly lucid way, as deviations of the real behavior of the device under test from the ideal, linear behavior can immediately and easily be identified, namely by simply comparing both graphical illustrations.

Particularly, the at least one characteristic quantity of the output signal and the at least one characteristic quantity of the model output signal are each plotted against at least one of a peak to average output power ratio, an average power and a maximum peak envelope power. Particularly for communication devices, these quantities are the relevant ones when characterizing transmitted signals. Thus, a measure for the deviation of the real behavior of the device under test from the ideal, linear behavior is obtained with respect to the relevant power variables of the device under test.

The at least one predefined distortion characteristic may comprise at least one of an adjacent channel leakage power ratio (ACLR) and an error vector magnitude (EVM). These quantities are particularly suitable for characterizing the performance of the device under test, as they provide a direct measure of the deviation of the real device under test from an ideal one having the linear behavior.

According to another aspect of the disclosure, alone or in combination with any other aspect, the at least one predefined distortion characteristic is adjustable by a user. In other words, the user may select which distortion characteristic or which distortion characteristics are determined and compared. Thus, the performance testing method can be easily adapted to fulfill the requirements of the user or of the particular device under test.

In another embodiment of the disclosure, the hard clipper model is generated such that it exhibits at least one of an ideal gain characteristic and an ideal phase transfer characteristic. The hard clipper model may also exhibit both the ideal gain characteristic and the ideal phase transfer characteristic. In other words, the hard clipper model is established as an ideal, linear model of the device under test.

Particularly, the hard clipper model is generated such that it exhibits at least one of a constant output phase over input power, a constant output power over frequency, a constant output phase over frequency, a constant output power over time, a constant output phase over time, a region of constant gain and a region of constant output power. Particularly, the hard clipper model exhibits several or even all of these properties or rather characteristics.

According to another aspect of the present disclosure, alone or in combination with any other aspect, in said region of constant output power the power level of the model output signal is set to be equal to saturated power of the device under test. In other words, in said region of constant output power the power level of the model output signal is set to be equal to the maximum output power the device under test is capable of providing. This way, the hard clipper model is adapted to the physical constraints that the device under test has.

Embodiments of the present disclosure further provide a measurement system for determining a performance of a device under test having non-linear characteristics, comprising a signal generator module, a signal analyzer module and a model module. The signal generator module is configured to generate a test signal having predefined properties. The signal generator module is connected with the device under test and with the model module. Further, the signal generator module is configured to forward said test signal to the device under test and to the model module. The signal analyzer module is connected with the device under test and is configured to receive and analyze an output signal generated by the device under test. The model module comprises a hard clipper model of said device under test and is configured to generate a model output signal based on said hard clipper model and based on said test signal. The measurement system is configured to compare said output signal to said model output signal in order to determine the performance of the device under test.

As already stated, the device under test has non-linear characteristics. In other words, if the device under test is supplied with an input signal having a certain amplitude, an amplitude of a corresponding output signal generated by the device under test does not scale linearly with the input signal amplitude but rather in a non-linear way.

The hard clipper model corresponds to an idealized model of the device under test. The hard clipper model does not exhibit a non-linear behavior as the device under test, but rather a linear behavior of output amplitude versus input amplitude.

Thus, by comparing the output signal of the device under test to the model output signal, the performance of the device under test can be directly compared with the idealized, i.e. best possible realization of the device under test. Accordingly, the performance of every device under test can be determined and compared in a meaningful way, as the hard clipper model forms a common and reproducible basis for the comparison, for instance an (absolute) benchmark. Thus, a measurement system being capable of a meaningful and reproducible performance test of the device under test is provided.

With respect to the remaining features and advantages, reference is made to the explanations given above with regard to the performance testing method, which likewise apply to the measurement system.

In particular, the measurement system is configured to perform the performance testing method explained above.

The comparison of the output signal and the model output signal may be performed by the model module and/or by the signal analyzer module. Alternatively or additionally, the comparison may be performed by a computer device, particularly a computer device providing the model module and/or the hard clipper model.

The signal generator module and/or the signal analyzer module may each be established in hardware and/or in software. Alternatively, the signal generator module and/or the signal analyzer module may be established as separate measurement instruments. Particularly, the signal generator module may be established as a standalone signal generator, for example as an arbitrary waveform generator.

For instance, the signal generator module relates to a software module that is electrically connected with the model module. Hence, a digital representative of the characteristic waveform may be forwarded to the model module.

In one embodiment of the present disclosure, the signal analyzer module is configured to determine at least one characteristic quantity of the output signal, wherein the at least one characteristic quantity comprises at least one predefined distortion characteristic, and wherein the model module is configured to determine the corresponding characteristic quantity of the model output signal. Generally, the distortion characteristic is a measure for the non-linearity of the device under test. Accordingly, by comparing the characteristic quantities comprising the distortion characteristic, a measure for the deviation of the device under test from the ideal, linear behavior is obtained.

The measurement system may further comprise a display, wherein the display is configured to plot at least said characteristic quantity of the output signal and the corresponding characteristic quantity of the model output signal simultaneously. This way, the result of the performance test is presented to a user in a particularly lucid way, as deviations of the device under test from the ideal, linear behavior can immediately and easily be identified.

In another embodiment of the present disclosure, a device under test is provided, wherein the device under test is connected to the signal generator module and to the signal analyzer module in a signal transmitting manner, and wherein the device under test is configured to generate said output signal based on said test signal.

According to another aspect of the present disclosure, alone or in combination with any other aspect, at least one of the signal generator module and the signal analyzer module is comprised in a measurement instrument. Both the signal generator module and the signal analyzer module may be comprised in the measurement instrument.

Particularly, the measurement instrument is established as at least one of an oscilloscope, a spectrum analyzer and a vector network analyzer. Alternatively, the measurement instrument may be established as any other type of measurement instrument that is suitable for conducting a performance test of the device under test.

The model module may be comprised in said measurement instrument. Accordingly, no further measurement devices are needed for conducting a performance test of the device under test.

Generally, the measurement instrument has a common housing that encompasses the respective components mentioned above, namely the signal generator module, the model module and/or the signal analyzer module.

In another embodiment of the present disclosure, a computer device comprising the model module is provided, wherein the computer device is established as at least one of a computer, a laptop, a tablet, a smartphone and another smart device. This way, the additional computational power provided by the computer device and/or an additional display comprised in said computer device can be employed for the performance test of the device under test. In other words, the measurement system comprises at least two separately formed devices.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
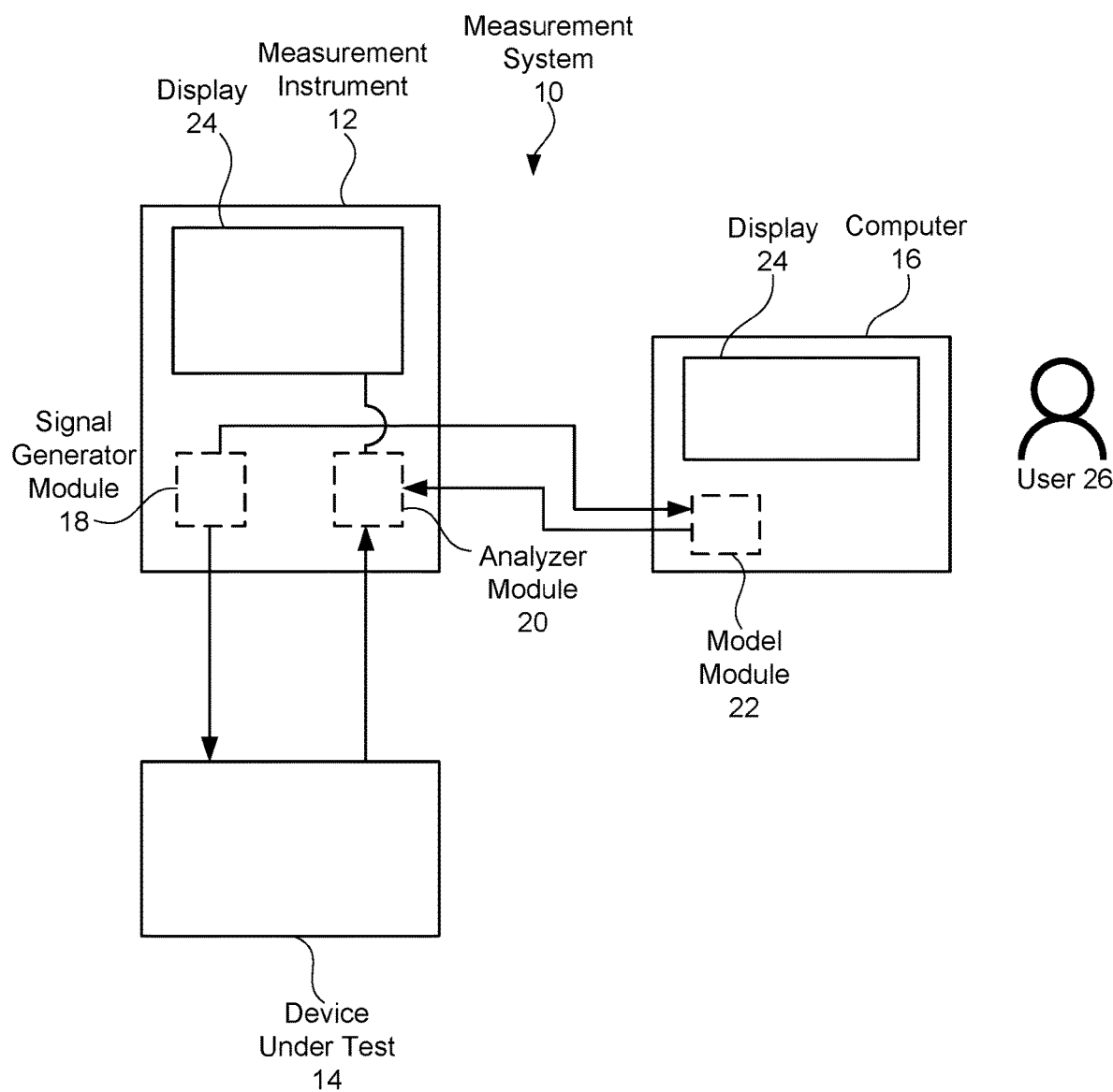
FIG. 1 schematically shows a block diagram measurement system according to the present disclosure.

FIG. 1 schematically shows a block diagram of a measurement system 10 comprising a measurement instrument 12, a separately formed device under test 14 and a separately formed computer device 16.

Particularly, the measurement instrument 12 is established as at least one of an oscilloscope, a spectrum analyzer and a vector network analyzer. Alternatively, the measurement instrument 12 may be established as any other type of measurement instrument that is suitable for conducting a performance test of the device under test 14.

The computer device 16 is established as at least one of a personal computer, a laptop, a tablet, a smartphone and any other kind of smart device.

The measurement instrument 12 comprises a signal generator module 18 and a signal analyzer module 20, wherein the device under test 14 is connected with both the signal generator module 18 and the signal analyzer module 20 in a signal transmitting manner.

The signal generator module 18 and/or the signal analyzer module 20 may each be established in hardware and/or in software. The functionality of these modules 18, 20 is described in more detail below.

Alternatively, the signal generator module 18 and/or the signal analyzer module 20 may be established as separate measurement instruments. Particularly, the signal generator module 18 may be established as a standalone signal generator, for example as an arbitrary waveform generator.

Generally speaking, the measurement system 10 is configured for determining a performance of devices under test that have non-linear characteristics.

Accordingly, the device under test 14 has non-linear characteristics. In other words, if the device under test 14 is supplied with an input signal having a certain amplitude, an amplitude of a corresponding output signal generated by the device under test 14 does not scale linearly with the input signal amplitude but rather in a non-linear way.

For example, the device under test 14 comprises a mixer, an amplifier, a filter and/or other types of components that cause the non-linear characteristics of the device under test 14, particularly due to imperfections that cannot be avoided.

Therein, at least part of the non-linear behavior may be caused by time distortions due to temperature, by frequency distortions due to intrinsic filter characteristics of the device under test 14 and/or by amplitude distortions due to saturation effects of semiconductors that are integrated into the device under test 14.

The computer device 16 comprises a model module 22 that is connected to both the signal generator module 18 and the signal analyzer module 20 in a signal transmitting manner.

The model module 22 is established in software, i.e. as a computer program. Alternatively, the model module 22 may be established as a combination of hardware and software or even as pure hardware. The functionality of the model module 22 is described in more detail below.

Moreover, the computer device 16 and/or the measurement instrument 12 comprise a display 24 that is connected to at least one of, particularly to all of, the signal generator module 18, the signal analyzer module 20 and the model module 22.

Figure 2:
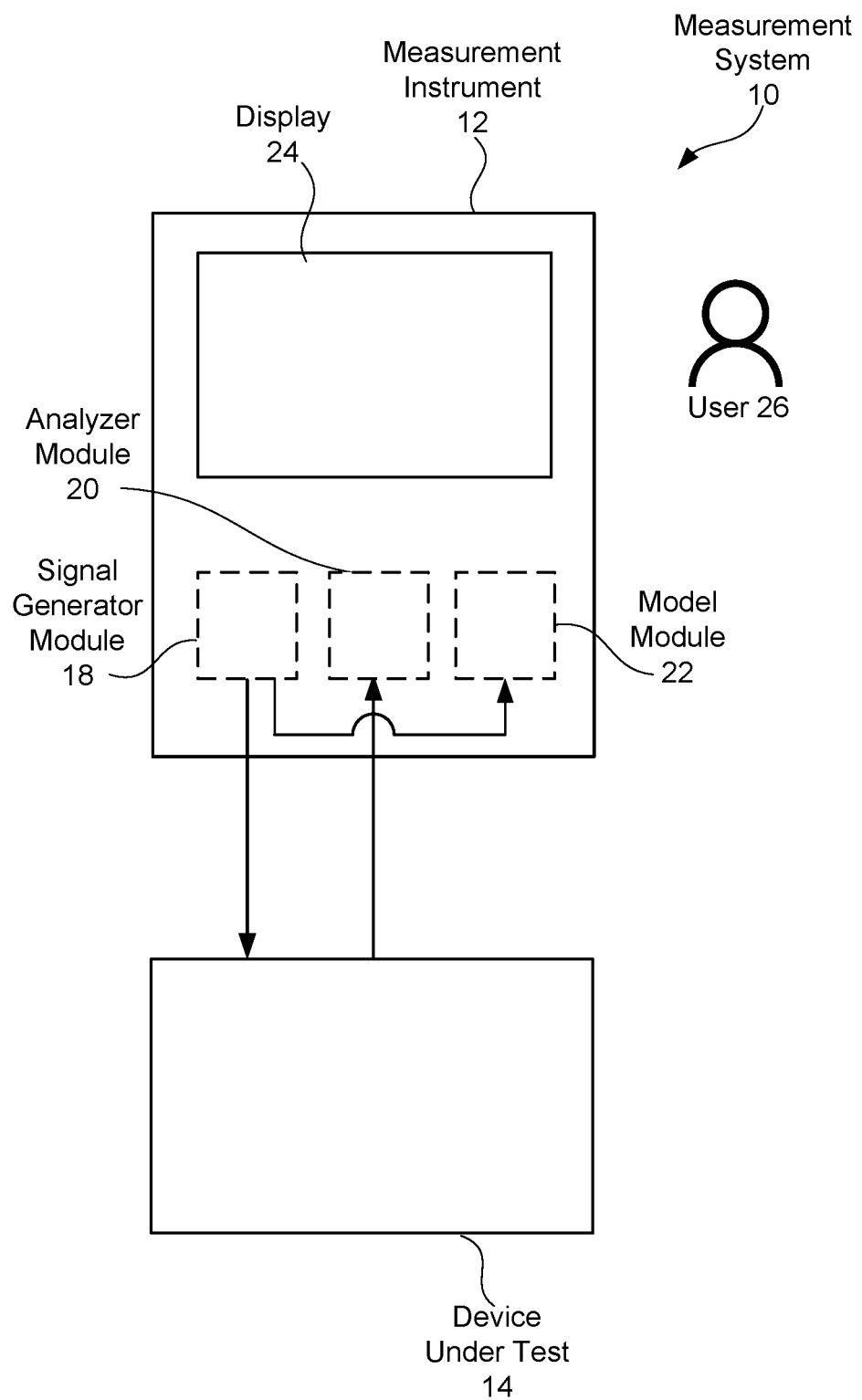
FIG. 2 schematically shows a block diagram of another measurement system according to the present disclosure.
Figure 3:
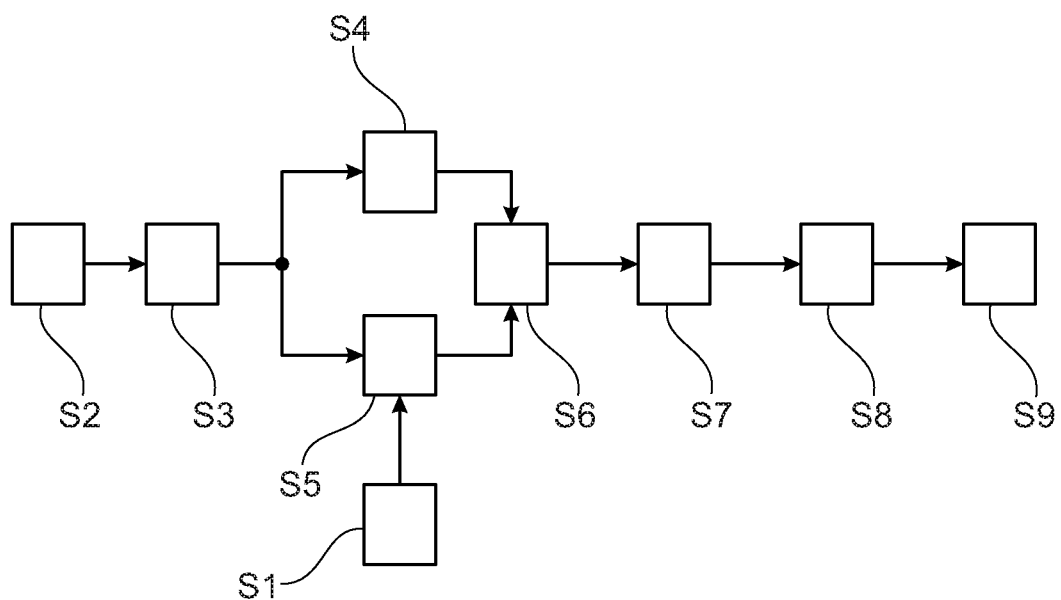
FIG. 3 shows a flow chart of a performance testing method according to the present disclosure.

FIG. 2 shows another measurement system 10, wherein parts with like functionality are labelled with the same reference numerals as in FIG. 1.

In FIG. 2, the model module 22 and the display 24 are comprised in the measurement instrument 12 rather than in an external computer device 16 as shown in FIG. 1. Apart from this difference, the explanations given above and below also apply to the measurement system 10 of FIG. 2.

Generally speaking, the measurement system 10 is configured to perform a performance testing method for determining a performance of the device under test 14, which performance testing method is described in more detail below with reference to FIGS. 3 to 7.

A hard clipper model of the device under test 14 is generated and/or loaded by the model module 22 (step S1).

The hard clipper model is an idealized model of the device under test 14. In general, the device under test 14 has non-linear characteristics, as already explained above. The hard clipper model does not exhibit this non-linear behavior, but rather a linear behavior of output amplitude versus input amplitude.

Figure 4:
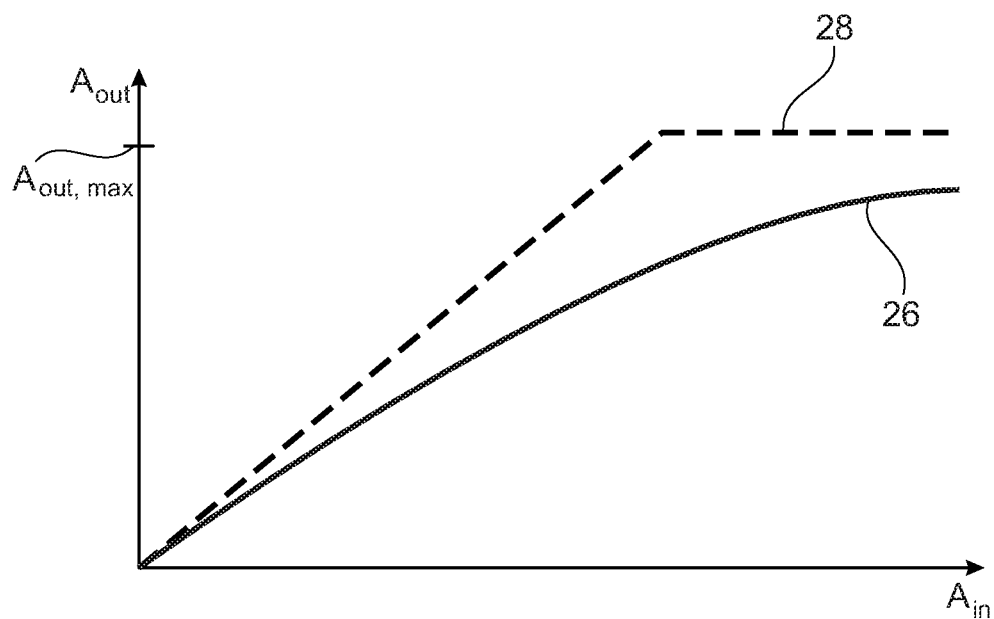
FIG. 4 schematically shows a diagram of an output signal amplitude plotted against an input signal amplitude for a device under test and a hard clipping model obtained from the performance testing method according to the present disclosure.

This is visualized in FIG. 4 that schematically shows a diagram of an output signal amplitude $A_{out}$ plotted against an input amplitude $A_{in}$. Therein, the solid line resembles a characteristic curve 26 of the actual device under test 14, while the dashed line resembles a characteristic curve 28 of the hard clipper model of the device under test 14.

It is apparent that the characteristic curve 26 of the device under test 14 deviates from a linear function at least in some areas of the plot in FIG. 4, in particular in areas of higher input amplitude. In other words, the characteristic curve 26 of the device under test 14 differs more from the linear behavior the higher the input amplitude is.

In contrast, the characteristic curve 28 of the hard clipping model remains linear until a maximum output power $A_{out,max}$, from where on it remains at a constant level being equal to the maximum output power $A_{out,max}$.

Particularly, the maximum output power $A_{out,max}$ is set to be equal to a saturated output power of the device under test 14, i.e. to the maximum output power the device under test 14 is capable of providing.

However, this is not the only way the device under test 14 differs from the hard clipping model.

Figure 5:
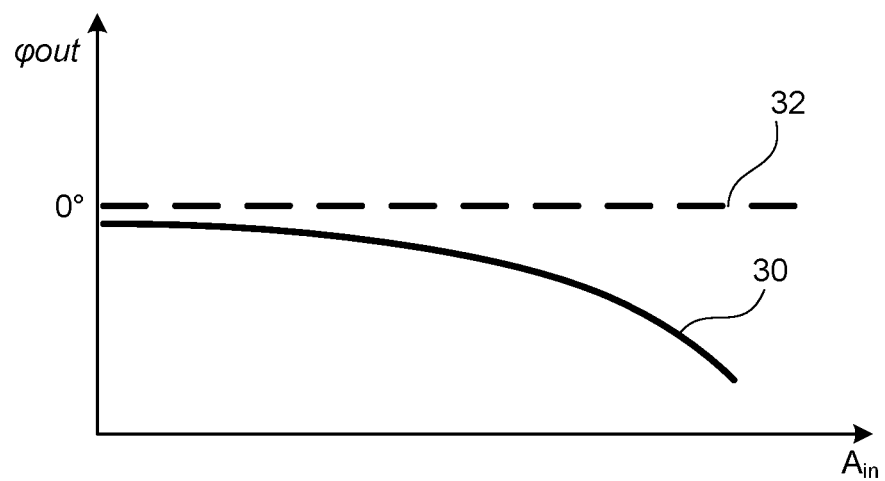
FIG. 5 schematically shows a diagram of an output signal phase plotted against an input signal amplitude for the device under test and the hard clipping model obtained from the performance testing method according to the present disclosure.

FIG. 5 shows a characteristic curve 30 of the actual device under test 14 and a corresponding characteristic curve 28 of the hard clipping model, wherein an output signal phase $\varphi_{out}$ is plotted against the input signal amplitude $A_{in}$.

The idealized characteristic curve 32 retains a constant output signal phase over input signal amplitude, while the characteristic curve 30 of the actual device under test 14 clearly deviates from the constant behavior, i.e. the output signal phase varies with the input signal amplitude.

Figure 6:
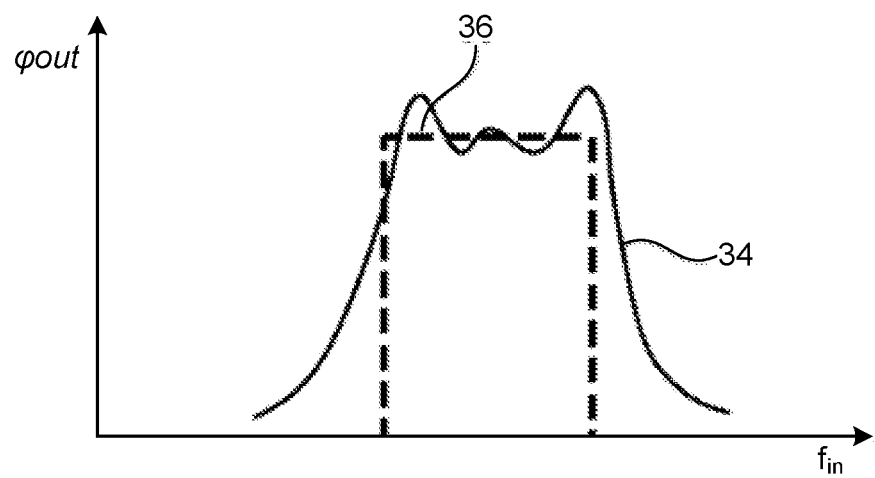
FIG. 6 schematically shows a diagram of an output signal power plotted against an input signal frequency for the device under test and the hard clipping model obtained from the performance testing method according to the present disclosure.

FIG. 6 shows a characteristic curve 34 of the actual device under test 14 and a corresponding characteristic curve 36 of the hard clipping model, wherein an output signal power $p_{out}$ is plotted against the input signal frequency $f_{in}$.

The idealized characteristic curve 36 is nonzero only within a sharply defined frequency band, and is constant within that frequency band. In other words, there are no out-of-band emissions. On the other hand, the characteristic curve 34 of the actual device under test 14 clearly deviates from the ideal behavior, i.e. the output signal power is non-constant in the certain frequency band and also contains out-of-band emissions.

Generally, the hard clipper model exhibits at least one of the following properties, in particular several or even all of the following properties: an ideal gain characteristic, an ideal phase transfer characteristic, a constant output phase over input power, a constant output power over frequency, a constant output phase over frequency, a constant output power over time, a constant output phase over time, a region of constant gain and a region of constant output power.

In a second step S2, a test signal is generated by the signal generator module 18, wherein the test signal has predefined properties. Therein, the term "predefined" is to be understood to include both a test signal that is adjustable by a user of the measurement system 10 and a test signal that is stored in a memory of the signal generator module 18 and/or of the measurement instrument 12. For example, the test signal is a standardized test signal that is adapted for the specific device under test 14. Particularly, the test signal is standardized to suit a communication protocol used by the device under test 14.

The test signal is then forwarded to both the device under test 14 and to the model module 22 (step S3).

Based on the test signal, the device under test 14 generates an output signal (step S4). In other words, the test signal is received by the device under test 14 and processed by whichever components the device under test 14 comprises such that the output signal is generated.

Moreover, the hard clipper model comprising the model module 22 is fed with the test signal and a model output signal is generated by the hard clipper model based on the test signal (step S5). Put differently, the test signal is received by the model module 22 and processed by the hard clipper model such that the model output signal is generated based on the test signal.

Now, both the output signal generated by the device on the test 14 and the model output signal generated by the hard clipper model are forwarded to the signal analyzer module 20 (step S6).

The signal analyzer module 20 determines at least one characteristic quantity of both the output signal and of the model output signal (step S7), wherein the characteristic quantity comprises at least one distortion characteristic.

Put differently, the signal analyzer module 20 analyzes both the output signal and the model output signal, and determines the respective characteristic quantity based on the output signal and the model output signal, respectively.

Generally, the distortion characteristic is a measure for the non-linearity of the device under test 14. Particularly, the distortion characteristic may comprise at least one of an adjacent channel leakage ratio (ACLR) and an error vector magnitude (EVM).

The user may choose which distortion characteristic is determined by the signal analysis module 20.

The signal analysis module 20 then compares the determined characteristic quantity of the output signal with the determined characteristic quantity of the model output signal in order to determine the performance of the device under test 14 (step S8).

Particularly, the signal analysis module 20 determines a deviation of the determined characteristic quantity of the output signal from the determined characteristic quantity of the model output signal, which deviation is a measure for the performance of the device under test 14.

Finally, the determined characteristic quantities are both plotted on the display 24 simultaneously (step S9), in particular on the display 24 of the measurement instrument 12 and/or on the display 24 of the computer device 16 to a user 26 (FIGS. 1 and 2). Thus, the characteristic quantities are plotted in the same diagram and deviations of the characteristic quantity of the output signal from the characteristic quantity of the model output signal can be identified in an easier manner.

Therein, the characteristic quantities are plotted against an peak to average output power ratio (PAPR), an average power and/or against a maximum peak envelope power of the output signal and the model output signal, respectively.

Figure 7:
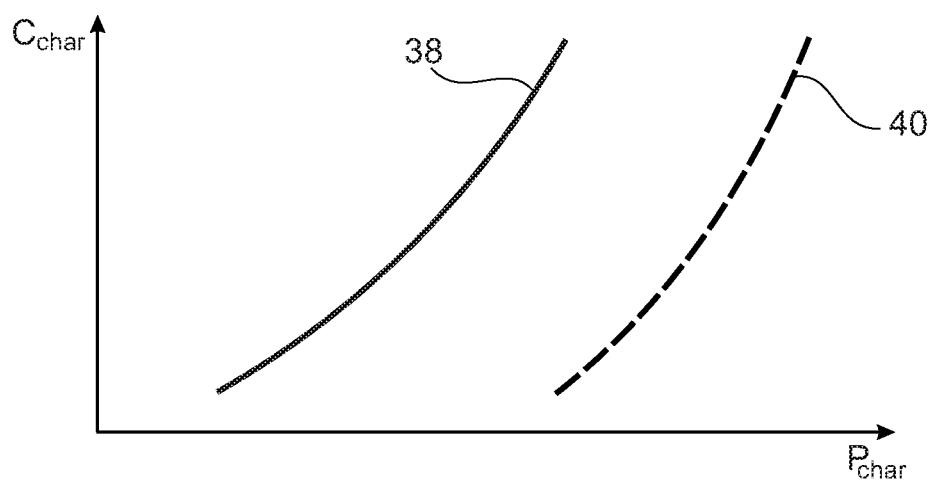
FIG. 7 schematically shows a diagram of a distortion characteristic plotted against a power variable obtained from the performance testing method according to the present disclosure.

The result of step S9 is shown in FIG. 7, which shows the resulting plot of the characteristic quantities, generally denoted by "$C_{char}$", against the peak to average output power ratio (PAPR), the average power and/or against the maximum peak envelope power, which is generally denoted by $P_{char}$, as being a power variable or rather a power characteristic. The resulting curve for the device under test 14 is represented by the solid line 38, while the resulting curve for the hard clipper model is represented by the dashed line 40.

The deviation, in particular the horizontal deviation of the characteristic quantity of the output signal from the characteristic quantity of the model output signal is a measure for the performance of the device under test 14. The closer the distance of the characteristic quantity of the output signal from the characteristic quantity of the model output signal the better the performance of the device under test 14.

The invention claimed is:

1. A performance testing method for determining a performance of a device under test having non-linear characteristics, comprising the following steps:
   generating a hard clipper model of said device under test;
   generating a test signal having predefined properties;
   forwarding said test signal to the device under test, wherein the device under test generates an output signal based on said test signal;
   feeding said hard clipper model with said test signal, thereby generating a model output signal; and
   comparing said output signal to said model output signal in order to determine the performance of the device under test,
   wherein at least one characteristic quantity of the output signal is determined and the corresponding characteristic quantity of the model output signal is determined, wherein the at least one characteristic quantity comprises at least one predefined distortion characteristic, and wherein the characteristic quantities of the output signal and the model output signal are compared with each other in order to determine the performance of the device under test,
   wherein the at least one characteristic quantity of the output signal and the at least one characteristic quantity of the model output signal are both visualized on a display simultaneously, and
   wherein the at least one characteristic quantity of the output signal and the at least one characteristic quantity of the model output signal are each plotted against at least one of a peak to average output power ratio, an average power and a maximum peak envelope power.

2. The performance testing method of claim 1, wherein the at least one predefined distortion characteristic comprises at least one of an adjacent channel leakage power ratio (ACLR) and an error vector magnitude (EVM).

3. The performance testing method of claim 1, wherein the at least one predefined distortion characteristic is adjustable by a user.

4. The performance testing method of claim 1, wherein the hard clipper model is generated such that it exhibits at least one of an ideal gain characteristic and an ideal phase transfer characteristic.

5. The performance testing method of claim 1, wherein the hard clipper model is generated such that it exhibits at least one of a constant output phase over input power, a constant output power over frequency, a constant output phase over frequency, a constant output power over time, a constant output phase over time, a region of constant gain and a region of constant output power.

6. The performance testing method of claim 5, wherein in said region of constant output power the power level of the model output signal is set to be equal to saturated power of the device under test.

7. A measurement system for determining a performance of a device under test having non-linear characteristics, comprising a signal generator module, a signal analyzer module and a model module,
   the signal generator module being configured to generate a test signal having predefined properties,
   the signal generator module being connected with the device under test and with the model module,
   the signal generator module further being configured to forward said test signal to the device under test and to the model module,
   the signal analyzer module being connected with the device under test and being configured to receive and analyze an output signal generated by the device under test,
   the model module comprising a hard clipper model of said device under test and being configured to generate a model output signal based on said hard clipper model and based on said test signal,
   wherein the measurement system is configured to compare said output signal to said model output signal in order to determine the performance of the device under test,
   wherein the signal analyzer module is configured to determine at least one characteristic quantity of the output signal, wherein the at least one characteristic quantity comprises at least one predefined distortion characteristic, and wherein the model module is configured to determine the corresponding characteristic quantity of the model output signal,
   wherein the measurement system further comprises a display, wherein the display is configured to plot at least said characteristic quantity of the output signal and the corresponding characteristic quantity of the model output signal simultaneously, and
   wherein the display is configured to plot each of the at least one characteristic quantity of the output signal and the at least one characteristic quantity of the model output signal against at least one of a peak to average output power ratio, an average power and a maximum peak envelope power.

8. The measurement system of claim 7, wherein a device under test is provided, wherein the device under test is connected to the signal generator module and to the signal analyzer module in a signal transmitting manner, and wherein the device under test is configured to generate said output signal based on said test signal.

9. The measurement system of claim 7, wherein at least one of the signal generator module and the signal analyzer module is comprised in a measurement instrument.

10. The measurement system of claim 9, wherein the model module is comprised in said measurement instrument.

11. The measurement instrument of claim 7, wherein at least one of a computer, a laptop, a tablet, a smartphone and another smart device comprising the model module is provided.

\* \* \* \* \*